United States Patent
Lee

(10) Patent No.: US 8,669,560 B2
(45) Date of Patent: Mar. 11, 2014

(54) LIGHT-EMITTING DEVICE, LIGHT-EMITTING DEVICE PACKAGE AND LIGHTING SYSTEM

(75) Inventor: Sanghyun Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/070,726

(22) Filed: Mar. 24, 2011

(65) Prior Publication Data

US 2011/0233558 A1 Sep. 29, 2011

(30) Foreign Application Priority Data

Mar. 25, 2010 (KR) ........................ 10-2010-0026931

(51) Int. Cl.
*H01L 33/04* (2010.01)
*H01L 29/15* (2006.01)

(52) U.S. Cl.
USPC ................. 257/76; 257/103; 257/E33.025

(58) Field of Classification Search
USPC .............. 257/76, 99, E33.025, E33.033, 257/E33.066, E33.056, 103
See application file for complete search history.

(56) References Cited

U.S. PATENT DOCUMENTS

| | | | |
|---|---|---|---|
| 5,661,074 A | 8/1997 | Tischler | |
| 2007/0045654 A1* | 3/2007 | Choi et al. | 257/103 |
| 2007/0120142 A1* | 5/2007 | Son | 257/103 |
| 2007/0131953 A1* | 6/2007 | Shim | 257/94 |
| 2007/0145406 A1* | 6/2007 | Han et al. | 257/103 |
| 2007/0210325 A1* | 9/2007 | Park et al. | 257/98 |
| 2007/0272936 A1 | 11/2007 | Shin | 257/97 |
| 2008/0023689 A1 | 1/2008 | Kim et al. | 257/13 |
| 2008/0142818 A1* | 6/2008 | Chen et al. | 257/88 |
| 2008/0251781 A1* | 10/2008 | Han et al. | 257/13 |
| 2008/0315233 A1* | 12/2008 | Kim | 257/98 |
| 2010/0084677 A1* | 4/2010 | Michellys | 257/98 |

FOREIGN PATENT DOCUMENTS

| | | |
|---|---|---|
| KR | 10-0665364 B1 | 12/2006 |
| KR | 10-0835116 B1 | 5/2008 |

OTHER PUBLICATIONS

Chinese Office Action dated Mar. 13, 2013 issued in Application No. 201110080075.1 (with English translation).
Chinese Office Action dated Nov. 18, 2013 for corresponding Chinese Application No. 201110080075.1.
Taiwanese Office Action dated Nov. 20, 2013 for corresponding Taiwanese Application No. 100110048.

* cited by examiner

*Primary Examiner* — William D Coleman
*Assistant Examiner* — Christine Enad
(74) *Attorney, Agent, or Firm* — Ked & Associates LLP

(57) ABSTRACT

Disclosed is a light-emitting device including: a support member; and a light-emitting structure on the support member, the light-emitting structure including a first semiconductor layer, at least one intermediate layer, an active layer and a second semiconductor layer, wherein the intermediate layer is on at least one of upper and lower regions of the active layer and comprises at least four layers, wherein the layers have different band gaps, and wherein, among the layers, a layer having the largest band gap contacts a layer having the smallest band gap. Based on this configuration, it is possible to reduce crystal defects and improve brightness of the light-emitting device through effective diffusion of current.

17 Claims, 12 Drawing Sheets

LIGHT-EMITTING DEVICE, LIGHT-EMITTING DEVICE PACKAGE AND LIGHTING SYSTEM

CROSS-REFERENCE TO RELATED APPLICATION

This application claims the priority benefit of Korean Patent Application No. 10-2010-0026931, filed on Mar. 25, 2010 in the Korean Intellectual Property Office, the disclosure of which is incorporated herein by reference.

BACKGROUND OF THE INVENTION

1. Field of the Invention

The present embodiment relates to a light-emitting device and a lighting system.

2. Description of the Related Art

A light-emitting diode (LED) is a device which converts electric signals into light using characteristics of compound semiconductors. LEDs are now being applied to devices such as home appliances, remote controls, electronic boards, displays, a variety of automatic appliances and the like and their application range continues to expand.

As the application range of LEDs expands, brightness required for lights in daily use and lights for structural signals increases. Accordingly, it is important to increase luminous efficacy of LEDs. However, a semiconductor layer such as GaN grown on a hetero-substrate such as a sapphire substrate has crystal defects due to lattice mismatch between the semiconductor layer and the hetero-substrate. These defects may have a negative effect on reliability of the light-emitting device and absorb light, thus reducing brightness thereof.

SUMMARY OF THE INVENTION

Therefore, the present embodiment has been made in view of the above problems, provides a light-emitting device to reduce crystal defects and improve brightness through effective diffusion of current.

In accordance with one aspect of the present embodiment, the above and other embodiment can be accomplished by the provision of a light-emitting device including: a support member, and a light-emitting structure on the support member, the light-emitting structure including a first semiconductor layer, at least one intermediate layer, an active layer and a second semiconductor layer, wherein the intermediate layer is on at least one of upper and lower regions of the active layer and comprises at least four layers, wherein the layers have different band gaps, and wherein, among the layers, a layer having the largest band gap contacts a layer having the smallest band gap.

Further, the layer having the largest band gap may include AlGaN and the layer having the smallest band gap may include InN.

BRIEF DESCRIPTION OF THE DRAWINGS

The present embodiment will be more clearly understood from the following detailed description taken in conjunction with the accompanying drawings, in which.

DETAILED DESCRIPTION OF THE PREFERRED EMBODIMENTS

Figure 1A:
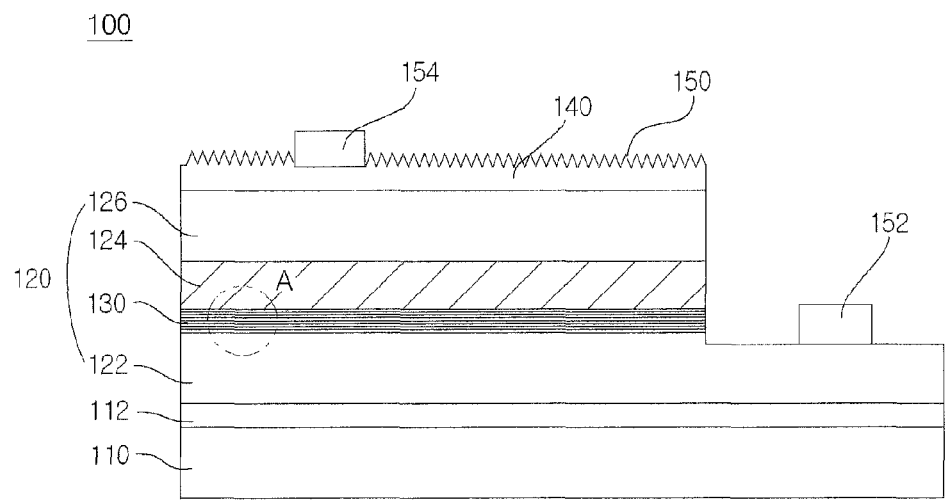
FIG. 1A is a sectional view illustrating the cross-section of a light-emitting device according to an embodiment.

Reference will now be made in detail to the embodiments of the present invention, examples of which are illustrated in the accompanying drawings. Wherever possible, the same reference numbers will be used throughout the drawings to refer to the same or like parts.

Prior to description of the embodiments, it will be understood that when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" of each layer will be described based on illustration in the drawings.

Hereinafter, the present embodiment will be described in more detail with reference to the annexed drawings.

Figure 1B:
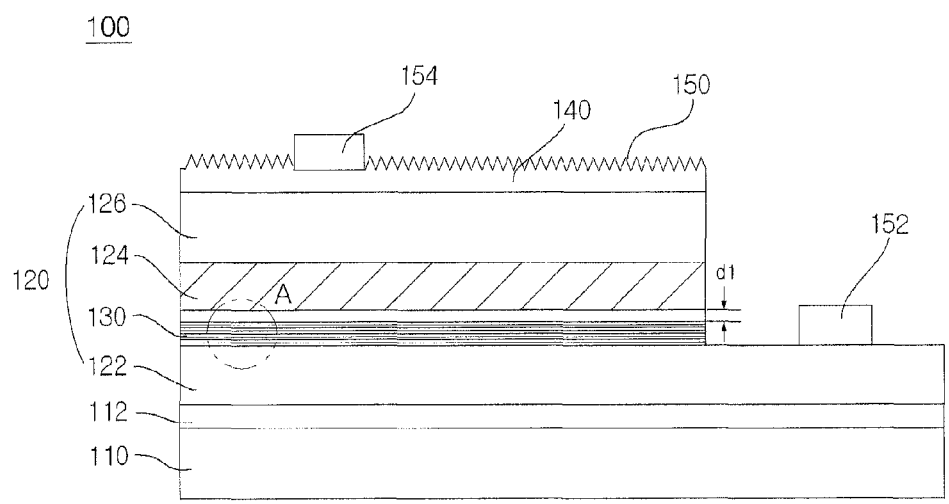
FIG. 1B is a sectional view illustrating the cross-section of a light-emitting device according to an embodiment.

FIGS. 1A and 1B are sectional views illustrating the cross-section of a light-emitting device according to one embodiment.

First, referring to FIGS. 1A and 1B, a light-emitting device 100 includes a support member 110 and a light-emitting structure 120 arranged on the support member 110, the light-emitting structure 120 including a first semiconductor layer 122, a first intermediate layer 130, an active layer 124 and second intermediate layer 126.

The support member 110 may be composed of a light-transmitting material selected from sapphire ($Al_2O_3$), GaN, SiC, ZnO, Si, GaP and GaAs and is not limited thereto. In addition, the support member 110 may be a SiC support member having higher thermal conductivity than the sapphire ($Al_2O_3$) support member. Preferably, the support member 110 has a smaller index of refraction than the first semiconductor layer 122 in order to improve light extraction efficiency.

Meanwhile, a patterned substrate (PSS) structure may be provided on the support member 110 to improve light extraction efficiency. The support member 110 mentioned herein may or may not have a PSS structure.

Meanwhile, although not shown, a buffer layer (not shown) may be arranged on the support member 110 to prevent lattice mismatch between the support member 110 and the first semiconductor layer 122 and facilitate growth of the semiconductor layers. The buffer layer 112 may be formed under a low temperature atmosphere and be selected from materials such as GaN, InN, AlN, AlInN, InGaN, AlGaN and InAlGaN.

The buffer layer 112 may be grown as a single crystal on the support member 110 and the buffer layer 112 grown as a single crystal buffer layer 112 can improve crystallinity of the first semiconductor layer 122.

The light-emitting structure 120 including the first semiconductor layer 122, the active layer 124 and the second intermediate layer 126 may be arranged on the buffer layer 112.

Hereinafter, the light-emitting structure 120 including the first semiconductor layer 122, the second intermediate layer 126, and the active layer 124 interposed therebetween, to produce light, will be described.

The first semiconductor layer 122 may be arranged on the buffer layer 112. The first semiconductor layer 120 may be an n-type semiconductor layer. For example, the n-type semiconductor layer may be selected from semiconductor materials such as GaN, AlN, AlGaN, InGaN, InN, InAlGaN and AlInN having the formula of $In_xAl_yGa_{1-x-y}N$ ($0 \leq x \leq 1$, $0 \leq y \leq 1$, $0 \leq x+y \leq 1$), and be doped with an n-type dopant such as Si, Ge, Sn, Se and Te.

Further, the light-emitting device may further include an undoped semiconductor layer (not shown) arranged under the first semiconductor layer 122, without being limited thereto. The undoped semiconductor layer improves crystallinity of the first semiconductor layer 122 and may be the same as the first semiconductor layer 122 except that the undoped semiconductor layer has lower electrical conductivity than the first semiconductor layer 122 since it is not doped with an n-type dopant.

The active layer 124 is formed on the first semiconductor layer 122. The active layer 124 may be formed with a single or multi-quantum well structure, a quantum wire structure, a quantum dot structure or the like using a compound semiconductor material composed of Group III-V elements.

In the case where the active layer 124 has a quantum well structure, for example, it may have a single or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be formed of a material having a band gap smaller than that of the barrier layer.

A conductive clad layer (not shown) may be arranged on and/or under the active layer 124. The conductive clad layer (not shown) may be formed of an AlGaN-based semiconductor, and may have a greater band gap than the active layer 124.

The first intermediate layer 130 may be arranged under the active layer 124.

That is, as shown in FIG. 1A, the first intermediate layer 130 contacts the active layer 124, or as shown in FIG. 1B, the first intermediate layer 130 may be formed in the first semiconductor layer 122 and be spaced from the active layer 124 by a predetermined distance, although the present invention is not limited thereto. Preferably, in the case where the first intermediate layer 130 is spaced from the active layer 124, the distance (d1) between the first intermediate layer 130 and the active layer 124 may be 1 nm to 100 nm.

Accordingly, the first intermediate layer 130 may be interposed between the first semiconductor layer 122 and the active layer 124, to prevent lattice mismatch between the first semiconductor layer 122 and the active layer 124.

Crystal defects may occur, since the difference in lattice constant between the support member 110 and the first semiconductor layer 122 made of a material such as sapphire is great, although the buffer layer 112 is formed on the support member 110. In particular, as the crystal defects increase depending on the growth direction, the first intermediate layer 130 is formed between the first semiconductor layer 122 and the active layer 124 to prevent diffusion of the crystal defects into the active layer 124. Accordingly, it is possible to reduce crystal defects of the active layer 124 and thus improve luminous efficiency.

Figure 2:
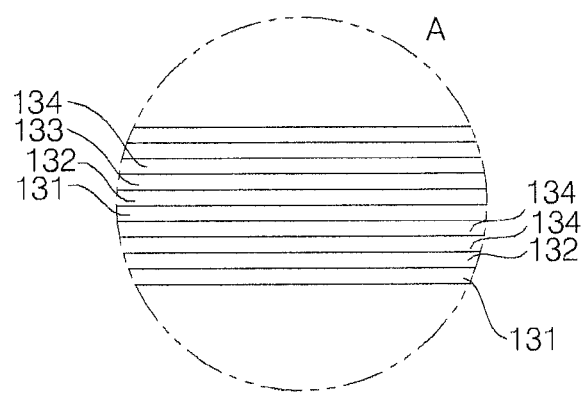
FIG. 2 is a partial enlarged view illustrating the A region of the light-emitting device shown in FIG. 1A.

In addition, as shown in FIG. 2 below, the first intermediate layer 130 includes a plurality of repeatedly laminated layers having different band gaps, to cause transverse diffusion of current. This structure of the first intermediate layer 130 will be described with reference to FIG. 2 below.

The second intermediate layer 126 may be a p-type semiconductor layer to inject holes into the active layer 124. The second intermediate layer 126 may be selected from semiconductor materials such as GaN, AlN, AlGaN, InGaN, InN, InAlGaN and AlInN having the formula of $In_xAl_yGa_{1-x-y}N$ ($0 \leq x \leq 1$, $0 \leq y \leq 1$, $0 \leq x+y \leq 1$), and be doped with a p-type dopant such as such as Mg, Zn, Ca, Sr and Ba.

The first semiconductor layer 122, the first intermediate layer 130, the active layer 124 and the second intermediate layer 126 may be formed by a method such as metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE), without being limited thereto.

In addition, the concentration of conductive dopant doped in the first semiconductor layer 122 and the second semiconductor layer 126 may be uniform or non-uniform. That is, the structure of a plurality of semiconductor layers with various doping concentration distributions may be formed, without being limited thereto.

In addition, the first semiconductor layer 122 may be a light-transmitting electrode layer 140, the second intermediate layer 126 may be an n-type semiconductor layer, and a third semiconductor layer (not shown) including a n-type or p-type semiconductor layer may be formed on the second intermediate layer 126. Accordingly, the light-emitting device 100 may have at least one of n-p, p-n, n-p-n and p-n-p junction structures. A light-transmitting electrode layer 140 and a second electrode pad 154 may be formed on the second intermediate layer 126.

The light-transmitting electrode layer 140 may include at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, to transmit light generated from the active layer 124 to the outside. In addition, the light-transmitting electrode layer 140 is partially or entirely formed on top of the second intermediate layer 126 to prevent current crowding.

The second electrode pad 154 may be formed on the light-transmitting electrode layer 140, or the second electrode pad 154 may be formed by removing a part of the light-transmitting electrode layer 140 to form an opening, such that the second electrode pad 154 comes into contact with the second intermediate layer 126, without being limited thereto.

A light extraction structure 150 is formed on the upper surface of the light-emitting structure 120.

The light extraction structure 150 may be formed on the upper surface of the light-transmitting electrode layer 140 formed on the light-emitting structure 120 or be formed on the upper surface of the second semiconductor layer 126, but formation of the light extraction structure 150 is not limited thereto.

The light extraction structure 150 may be formed at some regions or all regions on the upper surface of the light-transmitting electrode layer 140 or the second semiconductor layer 126. The light extraction structure 150 is formed by performing an etching process upon at least one region of the upper surface of the light-transmitting electrode layer 140 or the second semiconductor layer 126. Such an etching process includes a wet and/or dry etching process(s). Through the etching process, the upper surface of the light-transmitting electrode layer 140 or the upper surface of the second semiconductor layer 133 has roughness forming the light extraction structure 150 having a height of 0.1 µm to 3 µm. The roughness having a random size may be irregularly formed, but is not limited thereto. The roughness means an uneven upper surface and includes at least one of a texture pattern, a concave-convex pattern and an uneven pattern.

The cross-section of the roughness may have various shapes, such as a cylinder, a polyprism, a cone, a polypyramid, a circular truncated cone and a frustum of a pyramid, and preferably has a conical or polypyramidal shape.

The light extraction structure 150 may be formed by a photo-electro chemical (PEC) method, but formation of the light extraction structure 150 is not limited thereto. When the light extraction structure 150 is formed on the upper surface of the light-transmitting electrode layer 140 or the second semiconductor layer 126, re-absorption of light generated by the active layer 124 into the active layer 132 or scattering of the light due to total reflection of the light by the upper surface of the light-transmitting electrode layer 140 or the second semiconductor layer 126 is prevented, thereby contributing to improvement of light extraction efficiency of the light-emitting device 100.

Some regions of the first semiconductor layer 122 are exposed by removing some regions of the active layer 124 and the second semiconductor layer 126, and the first electrode pad 152 is formed on the upper surface of the first semiconductor layer 122 in the exposed region. That is, the first semiconductor layer 122 may include the upper surface facing the active layer 124 and the lower surface facing the support member 110, the upper surface of the first semiconductor layer 122 includes the exposed regions, and the first electrode pad 152 is disposed in the exposed regions of the upper surface of the first semiconductor layer 122.

Exposure of some regions of the first semiconductor layer 122 may be carried out using a specific etching method, but is not limited thereto. As the etching method, wet etching or dry etching may be used.

The first and second electrode pads 152 and 154 may be made of a conductive material, for example, one selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof, and be formed in a single layer or multi-layer structure. However, formation of the first and second electrode pads 152 and 154 is not limited thereto.

FIG. 2 is a partial enlarged view illustrating the region A of the light-emitting device of FIG. 1.

Referring to FIG. 2, the first intermediate layer 130 may have a multi-layer structure in which four or more layers having different band gaps are laminated.

Meanwhile, FIG. 2 illustrates a first intermediate layer 130 which has a multi-layer structure in which four or more layers 131 to 134 having different band gaps are laminated, but the structure of the first intermediate layer 130 is not limited thereto. That is, the first intermediate layer 130 may have a multi-layer structure in which four or more layers having four or more band gaps are laminated.

When the first intermediate layer 130 has a multi-layer structure in which four or more layers 131 to 134 having different band gaps are laminated, four or more different band gaps are successively connected in an energy band diagram, to stop propagation of dislocation defects generated under the first intermediate layer 130 and thus prevent the dislocation defects above the first intermediate layer 130.

Accordingly, the first intermediate layer 130 blocks crystal defects generated in the first semiconductor layer 122. As a result, the active layer 124 has a decreased number of crystal defects and improved crystal qualities.

Meanwhile, the first intermediate layer 130 may include a semiconductor layer made of GaN, InN, InGaN and AlGaN, and respective layers are arranged such that a layer having the smallest band gap contacts a layer having the largest band gap, among the layers forming a multilayer structure.

When the two materials having a large band gap difference come into contact with each other, a region in which the energy band is divided, called "band off-set", occurs. As a result, flow of electrons in one direction in the conduction band can be prevented. Accordingly, current can be efficiently transversely diffused under the active layer 124.

Meanwhile, as the concentration of Al increases, the band gap increases, and when the concentration of indium (In) increases, the band gap decreases. Accordingly, the layer including InN has the lowest band gap and the layer including AlGaN has the highest band gap. Accordingly, the layer including AlGaN having the largest band gap and the layer including InN having the smallest band gap are continuously formed.

Meanwhile, referring to FIG. 2, four layers 131 to 134 having four different band gaps are formed and these four layers as one unit are repeatedly laminated. The layers may be laminated in the order of GaN/InN/AlGaN/InGaN, GaN/AlGaN/InN/InGaN, InGaN/GaN/AlGaN/InN, InN/AlGaN/InGaN/GaN or the like, without being limited thereto. Preferably, the layer including InN and the layer including AlGaN are continuously formed.

The layer including InGaN and the layer including GaN reduce tensile stress generated in an AlGaN layer having a large band gap and compression stress generated in an InN layer having a small band gap. Accordingly, the first intermediate layer 130 reduces stress between the two layers having different band gaps, prevents dislocation defects and improves reliability of the light-emitting device.

Meanwhile, when the layers 131 to 134 constituting the first intermediate layer 130 are excessively thick, luminous efficiency of the light-emitting device may be deteriorated, and when the layers 131 to 134 are excessively thin, it is difficult to secure crystal defect reduction and current diffusion. Accordingly, the layers 131 to 134 constituting a multi-layer structure of the first intermediate layer 130 have a thickness of 5 to 100 Å.

Preferably, the aforementioned four layers 131 to 134 are repeatedly laminated to form a super-lattice structure. When the first intermediate layer 130 has a super-lattice structure, crystal defects can be more efficiently prevented.

In addition, at least one of the layers 131 to 134 constituting a multi-layer structure of the first intermediate layer 130 may be doped with an n-type impurity such as Si, Ge, Sn or a p-type impurity such as Mg, Zn, Ca, Sr, Ba or may be undoped in order to provide high resistance. Such a high-resistance first intermediate layer 130 realizes uniform dispersion over the surface on which electrons are injected to efficiently reduce drive voltage.

In addition, so as to more efficiently prevent dislocation defects, indium (In) may be added as an impurity to at least a part of the first intermediate layer 130. The indium (In) added as an impurity to the first intermediate layer 130 may serve as a surfactant to more efficiently improve dislocation defects of the active layer 124 and the second intermediate layer 126 arranged on the first intermediate layer 130.

Meanwhile, although FIG. 2 illustrates a structure in which four layers 131 to 134 are repeatedly laminated, five or six semiconductor layers including GaN, InN, AlGaN and InGaN are laminated, and the laminate of the five or six semiconductor layers as one unit is repeated.

For example, when five layers are laminated as one unit, the layers are laminated in the order of GaN/InN/AlGaN/GaN/InGaN, and when six layers are laminated as one unit, the layers are laminated in the order of GaN/InGaN/InN/AlGaN/GaN/InGaN. The lamination order is not limited thereto and may be varied. In any case, it is preferable that the layer including InN and the layer including AlGaN be continuously formed.

Figure 3A:
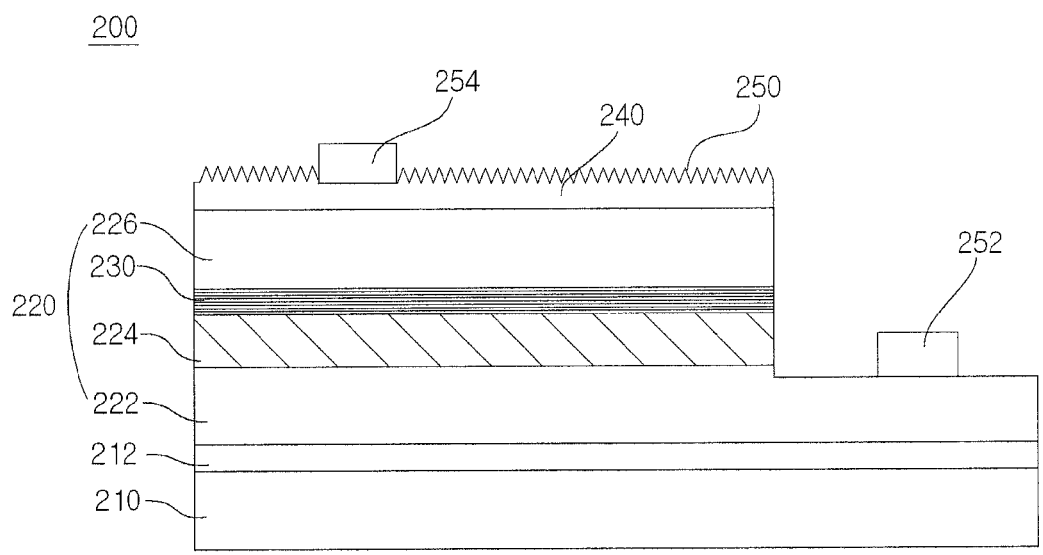
FIG. 3A is a sectional view illustrating the cross-section of a light-emitting device according to an embodiment.
Figure 3B:
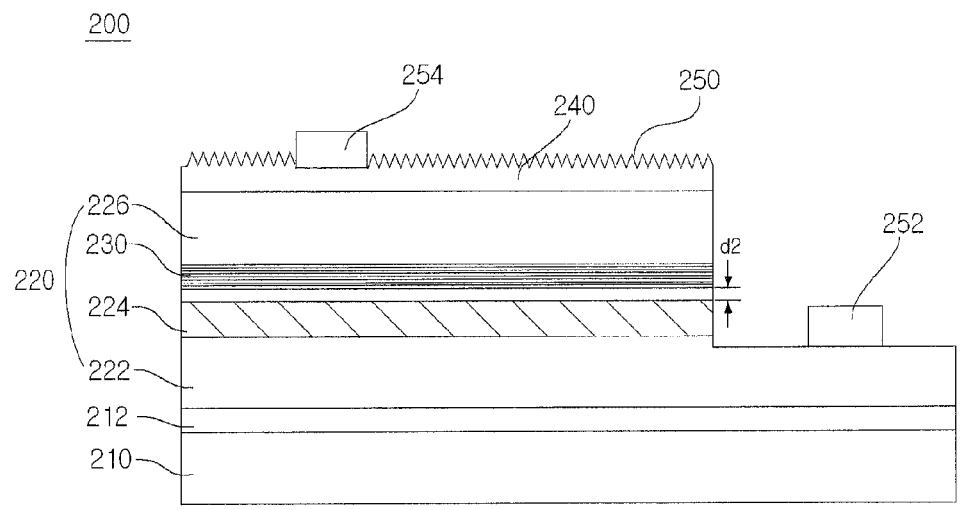
FIG. 3B is a sectional view illustrating the cross-section of a light-emitting device according to an embodiment.

FIGS. 3A and 3B are sectional views illustrating the light-emitting device according to one embodiment.

Referring to FIGS. 3A and 3B, the light-emitting device 200 includes a support member 210 and a light-emitting structure 220 arranged on the support member 210, the light-emitting structure 220 including a first semiconductor layer 222, an active layer 224, a second intermediate layer 230, and a second semiconductor layer 226.

In the following, the same elements as those described in FIG. 1 will be not described again and only points different from those described in FIG. 1 will be described.

The light-emitting device 200 may include the second intermediate layer 230 arranged on the active layer 224.

Since crystal defects caused by the lattice constant between the support member 210 and the light-emitting structure 220 arranged on the support member 210 increases, depending on the growth direction, the second semiconductor layer 226 arranged in a region farthest from the support member 210 has the greatest crystal defects.

In particular, taking into consideration the fact that hole mobility is lower than electron mobility, deterioration in hole injection efficiency caused by deterioration in crystallinity of the second semiconductor layer 226 may cause a deterioration in luminous efficiency of the light-emitting device 200.

However, when the second intermediate layer 230 is formed between the active layer 224 and the second semiconductor layer 226 in this embodiment, propagation of crystal defects can be prevented and crystal defects of the second semiconductor layer 226 can thus be reduced.

In addition, the second intermediate layer 230 reduces stress caused by the difference in lattice constant between the second semiconductor layer 226 and the active layer 224 and decreases a polarization phenomenon caused by the piezoelectric field.

The second intermediate layer 230 may have the same structure as the first intermediate layer 130 illustrated in FIG. 2. That is, four or more layers with different band gaps including GaN/InN/AlGaN/InGaN may be repeatedly laminated to form a super-lattice structure, and the intermediate layers 230 constituting the multi-layer structure of the second intermediate layer 230 may have a thickness of 5 to 100 Å.

In addition, the second intermediate layer 230 contacts the active layer 224, as shown in FIG. 3A, or may be spaced from the active layer 224 by a predetermined distance, as shown in FIG. 3B, although the present invention is not limited thereto. Preferably, in the case where the second intermediate layer 240 is spaced from the active layer 224, the distance (d2) between the second intermediate layer 240 and the active layer 224 may be 1 nm to 100 nm.

In addition, preferably, the layer having the largest band gap contacts a layer having the smallest band gap, among the layers forming a multilayer structure. Preferably, the layer including AlGaN having the largest band gap and the layer including InN having the smallest band gap are continuously formed.

As mentioned above, when the InN and AlGaN layers have a large band gap distance, flow of holes in one direction in the valence band can be prevented due to band off-set. Accordingly, transverse diffusion of current can be induced in an upper region of the active layer 224 by varying the flow direction of holes.

Further, the layers constituting the multi-layer structure of the second intermediate layer 230 include a layer including GaN and a layer including InGaN, as mentioned above, the layer including InGaN and the layer including GaN reduce tensile stress generated in an AlGaN layer having a large band gap and compression stress generated in an InN layer having a small band gap. Accordingly, the second intermediate layer 240 reduces stress between the two layers having different band gaps, prevents dislocation defects and improves reliability of the light-emitting device.

Meanwhile, the second intermediate layer 230 may be at least partially doped with an n-type impurity such as Si or a p-type impurity such as Mg, or may be undoped in order to provide high resistance. Such a high-resistance second intermediate layer 230 realizes uniform dispersion over the surface, on which electrons are injected, to efficiently reduce drive voltage.

In addition, indium (In) serving as a surfactant is added as an impurity to at least a part of the second intermediate layer 230 and is thus fixed as dislocation defect, thereby more efficiently reducing dislocation defect of the second semiconductor layer 226.

Figure 4:
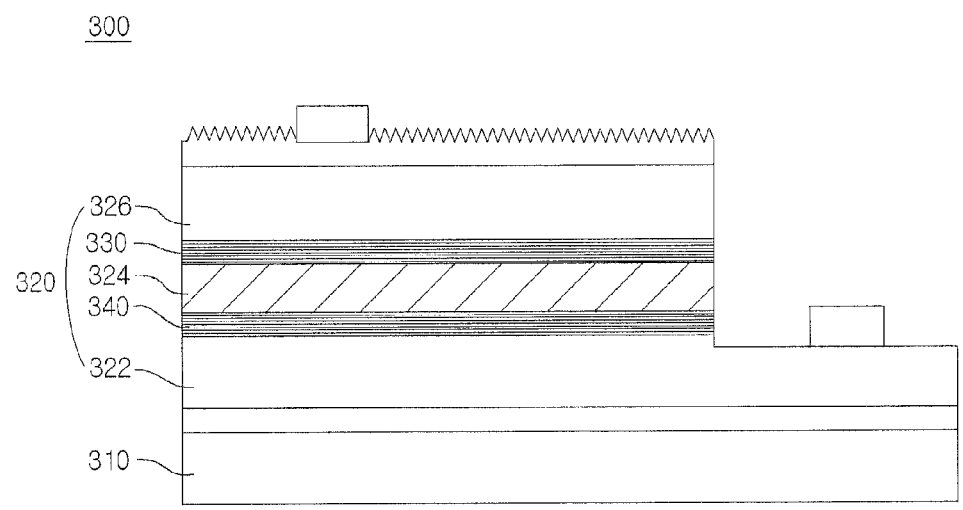
FIG. 4 is a sectional view illustrating the cross-section of a light-emitting device according to an embodiment.

FIG. 4 is a sectional view illustrating the light-emitting device according to another embodiment.

Referring to FIG. 4, a light-emitting device 300 includes a support member 310 and a light-emitting structure 320 arranged on the support member 310, the light-emitting structure 320 including a first semiconductor layer 322, a second intermediate layer 340, an active layer 324, a third intermediate layer 330 and a second semiconductor layer 326.

Referring to FIG. 4, the third intermediate layer 330 arranged on the active layer 324 and the second intermediate layer 340 arranged under the active layer 324 are simultaneously formed.

The third intermediate layer 330 and the second intermediate layer 340 have the same as the structure and effects, as illustrated in FIGS. 1A to 3B.

In addition, the third and second intermediate layers 330 and 340 contact the active layer 324 or may be spaced from the active layer 324 by a predetermined distance, although the present invention is not limited thereto.

Preferably, in the case where the third and second intermediate layers 330 and 340 are spaced from the active layer 324, the distance between the third and second intermediate layers 330 and 340, and the active layer 324 may be 1 nm to 100 nm.

That is, the third intermediate layer 330 arranged between the first semiconductor layer 322 and the active layer 324 prevents crystal defects from propagating to the active layer 324 and results in transverse diffusion of current.

In addition, the second intermediate layer 340 between the active layer 324 and the second semiconductor layer 326 blocks electric potential propagated to the active layer 324 or additional propagation of crystal defects, and reduces the stress due to the difference in lattice constant between the second semiconductor layer 326 and the active layer 324, thus decreasing polarization induced by the piezoelectric field. In addition, transverse diffusion of current can be induced in an upper region of the active layer 224 by varying the flow direction of holes.

Accordingly, as shown in FIG. 4, the third intermediate layer 330 and the second intermediate layer 340 are simultaneously formed, to more efficiently prevent dislocation defects and manufacture a light-emitting device 300 with improved crystallinity. Accordingly, brightness of the light-emitting device 300 can be improved.

Meanwhile, although the horizontal light-emitting device has been illustrated, the present invention may be applied to vertical light-emitting devices and flip chip light-emitting devices.

FIGS. 5A to 5E are sectional views illustrating the light-emitting device according to another embodiment.

Referring to the drawings, a light-emitting device 400 according to this embodiment includes a support member 410, a first electrode layer 420 arranged on the support member 410, a light-emitting structure 430 arranged on the first electrode layer 420 and the light-emitting structure 430 including a first semiconductor layer 432, a first intermediate layer 440, an active layer 434 and a second semiconductor layer 436, and a second electrode layer 464 arranged on the second semiconductor layer 436.

The support member 410 may be made of a material with superior thermal conductivity or a conductive material and may be a support substrate composed of a material such as a metal or conductive ceramic. The support member 410 may have a monolayer, dilayer or multilayer structure.

That is, the support member 410 may be composed of a metal selected from Au, Ni, W, Mo, Cu, Al, Ta, Ag, Pt and Cr or an alloy thereof, or may be formed by laminating two or more different materials. In addition, the support member 410 may be realized with a carrier wafer such as Si, Ge, GaAs, ZnO, SiC, SiGe, GaN, or $Ga_2O_3$.

Such a support member 410 facilitates discharge of heat generated by the light-emitting device 400 and thus improves thermal stability of the light-emitting device 400.

The first electrode layer 420 is arranged on the support member 410. The first electrode layer 420 may include at least one of an ohmic layer (not shown), a reflective layer (not shown) and a bonding layer (not shown). For example, the first electrode layer 420 is formed on the support member 310. The first electrode layer 320 includes at least one of an Ohmic layer (not shown), a reflective layer (not shown) and a bonding layer (not shown). For example, the first electrode layer 320 may be formed in an Ohmic layer/reflective layer/bonding layer laminate structure, an Ohmic layer/reflective layer laminate structure or a reflective layer (including an Ohmic layer)/bonding layer laminate structure, but is not limited thereto. For example, the first electrode layer 320 may be formed in a structure that a reflective layer and an Ohmic layer are sequentially laminated on an insulating layer.

The reflective layer (not shown) is disposed between the Ohmic layer (not shown) and the insulating layer (not shown), and may be made of a material having excellent reflectivity, for example, one selected from Ag, Ni, Al, Rh, Pd, Ir, Ru, Mg, Zn, Pt, Au and Hf or a combination thereof, or be formed in a multilayer structure using the metal material and a light-transmitting conductive material such as IZO, IZTO, IAZO, IGZO, IGTO, AZO and ATO. Further, the reflective layer (not shown) may be formed in an IZO/Ni laminate structure, an AZO/Ag laminate structure, an IZO/Ag/Ni laminate structure or an AZO/Ag/Ni laminate structure. Further, if the reflective layer (not shown) is made of a material which comes into Ohmic contact with the light-emitting structure (for example, the first semiconductor layer 432), the Ohmic layer (not shown) may be omitted, but the reflective layer (not shown) is not limited thereto.

The Ohmic layer (not shown) comes into Ohmic contact with the lower surface of the light-emitting structure 430, and is formed as a layer or a plurality of patterns. The Ohmic layer (not shown) may be made of a light-emitting conductive layer and metal, selectively. For example, the Ohmic layer (not shown) may be formed in a single layer structure or a multilayer structure using at least one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au and Ni/$IrO_x$/Au/ITO. The Ohmic layer (not shown) serves to facilitate injection of carriers into the first semiconductor layer 432 and is not a necessity.

Further, the first electrode layer 420 may include the bonding layer (not shown). The bonding layer (not shown) may be made of a barrier metal or a bonding metal, for example, at least one selected from Ti, Au, Sn, Ni, Cr, Ga, In, Bi, Cu, Ag and Ta, but is not limited thereto.

The light-emitting structure 430 includes the first semiconductor layer 432, the active layer 434 and the second semiconductor layer 436, and the active layer 434 is formed between the first semiconductor layer 432 and the second semiconductor layer 436.

The first semiconductor layer 432 may be a p-type semiconductor layer doped with a p-type dopant and the second semiconductor layer 436 may be an n-type semiconductor layer doped with an n-type dopant. The respective p-type semiconductor layer and the n-type semiconductor layer are substantially equal to those of the former embodiments, and a detailed description thereof will thus be omitted.

Further, in this embodiment, the third intermediate layer 440 may be arranged under the active layer 434.

The third intermediate layer 440 may be the same structure as the first intermediate layer 130 illustrated in FIG. 2. That is, four or more layers with different band gaps including GaN/InN/AlGaN/InGaN may be repeatedly laminated to form a super-lattice structure, and the layers constituting the multilayer structure of the third intermediate layer 440 may have a thickness of 5 to 100 Å.

In addition, the third intermediate layer 440 contacts the active layer 434, or may be spaced from the active layer 434 by a predetermined distance, although the present invention is not limited thereto. Preferably, in the case where the third intermediate layer 440 is spaced from the active layer 434, the distance (d3) between the second intermediate layer 440 and the active layer 434 may be 1 nm to 100 nm.

In addition, preferably, the layer having the smallest band gap contacts a layer having the largest band gap, among the layers forming a multilayer structure. Preferably, the layer including AlGaN having the largest band gap and the layer including InN having the smallest band gap are continuously formed.

Figure 5A:
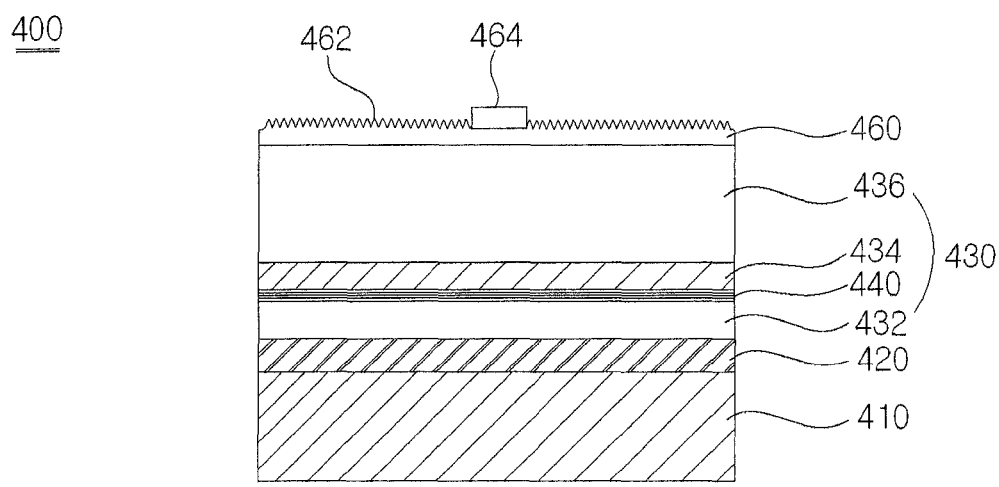
FIG. 5A is a sectional view illustrating the cross-section of a light-emitting device according to an embodiment.
Figure 5B:
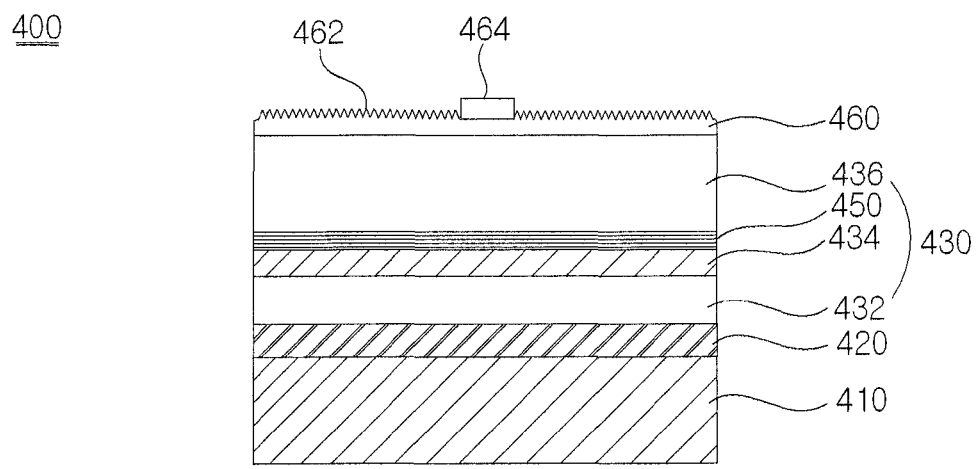
FIG. 5B is a sectional view illustrating the cross-section of a light-emitting device according to an embodiment.

Meanwhile, although only the third intermediate layer 440 arranged under the active layer 434 is illustrated in FIG. 5A, a fourth intermediate layer 450 may be arranged on the active layer 434 or third and fourth intermediate layers 440 and 450 may be arranged thereon, as shown in FIG. 5B, but it not limited thereto.

A light-transmitting electrode layer 460, a light extraction structure 462 and a second electrode layer 464 may be arranged on the second semiconductor layer 436.

The light-transmitting electrode layer 460 may be composed of at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO and is arranged on the second semiconductor layer 436 to prevent current crowding.

The second electrode layer 464 includes an electrode having at least one pad and/or predetermined pattern. The second electrode layer 464 may be arranged in central, peripheral or corner regions on the upper surface of the second semiconductor layer 436 and the arrangement of the second electrode layer 464 is not limited thereto.

The second electrode layer 464 may be formed in a single layer structure or a multilayer structure using a conductive material, for example, a metal In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof.

The second electrode layer 464 may be arranged on the light-transmitting electrode layer 460, or may be formed by removing a part of the light-transmitting electrode layer 460 to form an opening, such that the second electrode layer 464 comes into contact with the second semiconductor layer 436, without being limited thereto.

The light extraction structure 462 may be arranged on the light-emitting structure 430.

The light extraction structure 462 may be formed in a partial or entire region on the upper surface of the light-transmitting electrode layer 460 or the upper surface of the second semiconductor layer 436, but formation of the light extraction structure 462 is not limited thereto.

The light extraction structure 462 may be formed at some regions or all regions on the upper surface of the light-transmitting electrode layer 460 or the second semiconductor layer 436. The light extraction structure 462 is formed by performing an etching process upon at least one region of the upper surface of the light-transmitting electrode layer 460 or the second semiconductor layer 436. Such an etching process includes a wet and/or dry etching process(s). Through the etching process, the upper surface of the light-transmitting electrode layer 140 or the upper surface of the second semiconductor layer 436 has roughness forming the light extraction structure 462 having a height of 0.1 μm to 3 μm. The roughness having a random size may be irregularly formed, but is not limited thereto. The roughness means an uneven upper surface and includes at least one of a texture pattern, a concave-convex pattern and an uneven pattern.

The cross-section of the roughness may have various shapes, such as a cylinder, a polyprism, a cone, a polypyramid, a circular truncated cone and a frustum of a pyramid, and preferably has a conical or polypyramidal shape.

The light extraction structure 462 may be formed by a photo-electro chemical (PEC) method, but formation of the light extraction structure 462 is not limited thereto. When the light extraction structure 462 is formed on the upper surface of the light-transmitting electrode layer 140 or the second semiconductor layer 126, re-absorption of light generated by the active layer 124 into the active layer 132 or scattering of the light due to total reflection of the light by the upper surface of the light-transmitting electrode layer 460 or the second semiconductor layer 436 is prevented, thereby contributing to improvement of light extraction efficiency of the light-emitting device 400.

Meanwhile, a passivation layer (not shown) may be formed at the side and an upper region of the light-emitting structure 430 and may be made of an insulating material.

Figure 6A:
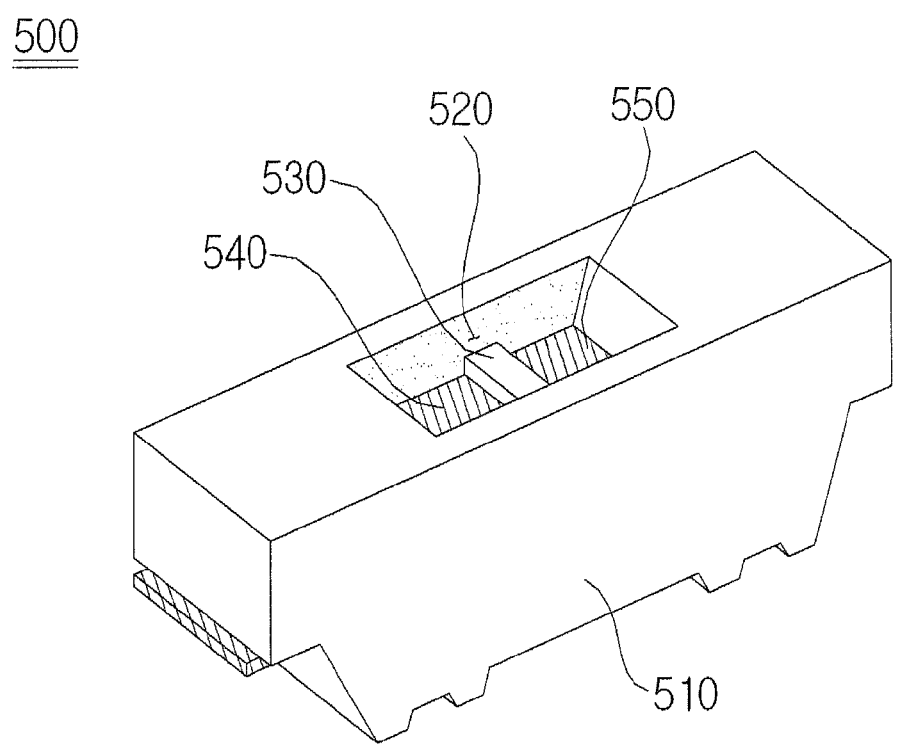
FIG. 6A is a perspective view illustrating a light-emitting device package including the light-emitting device according to an embodiment.
Figure 6B:
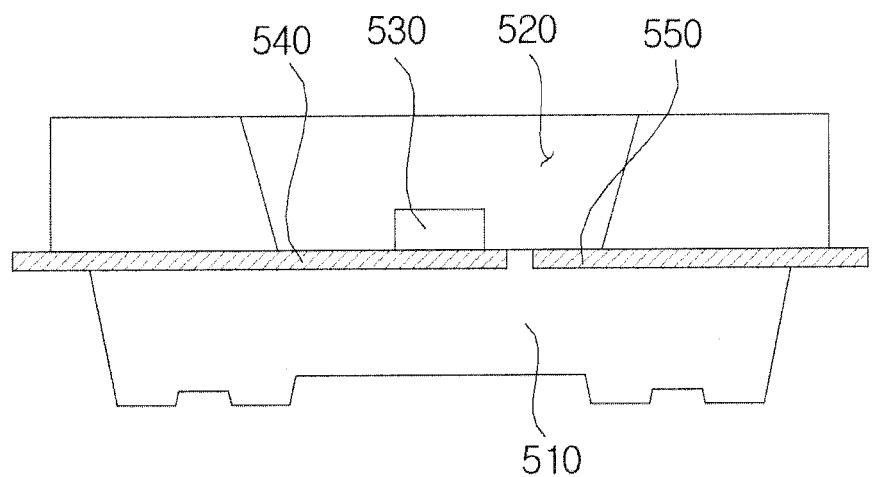
FIG. 6B is a sectional view illustrating a light-emitting device package including the light-emitting device according to an embodiment.
Figure 6C:
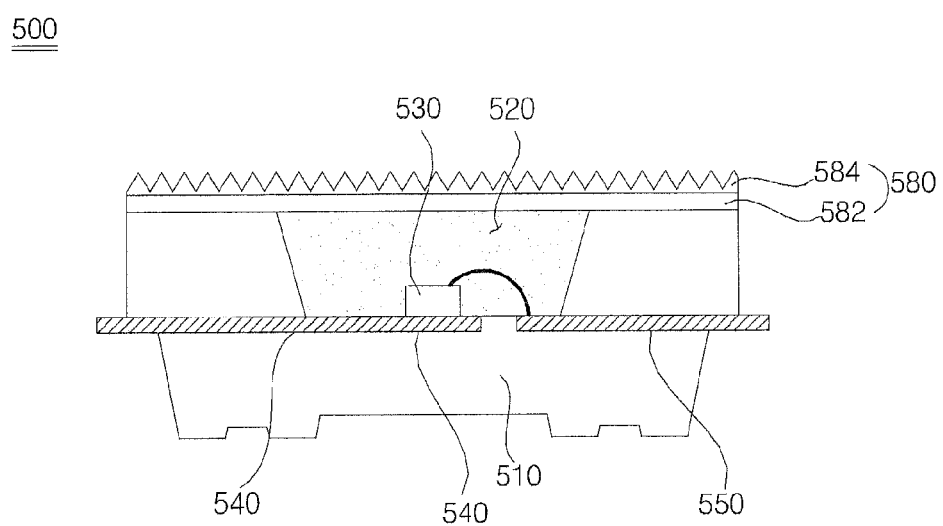
FIG. 6C is a sectional view illustrating a light-emitting device package including the light-emitting device according to an embodiment.

FIGS. 6A to 6C are a perspective view and a sectional view illustrating a light-emitting device package according to another embodiment.

Referring to FIGS. 6A to 6C, a light-emitting device package 500 includes a body 510 including a cavity 520, first and second lead frames 540 and 550 mounted on the body 510, a light-emitting device 530 electrically connected to the first and second lead frame 540 and 550, and a sealant (not shown) filling the cavity 520 to cover the light-emitting device 530.

The body 510 may be composed of at least one selected from resin materials such as polyphthalamide (PPA), silicon (Si), aluminum (Al), aluminum nitride (AlN), photo sensitive glass (PSG), polyamide9T (PA9T), syndiotactic polystyrene (SPS), metal materials, sapphire ($Al_2O_3$), beryllium oxide (BeO) and printed circuit boards (PCB). The body 510 may be formed by a process such as injection molding and etching, without being limited thereto.

The inner surface of the body 510 may include an inclined surface. The reflective angle of light emitted from the light-emitting device 530 may be varied, depending on the angle of the inclined surface. Accordingly, the orientation angle of light discharged to the outside can be controlled.

As the orientation angle of light decreases, convergence of light emitted from the light-emitting device 530 to the outside increases. On the other hand, as the orientation angle of light increases, convergence of light from the light-emitting device 530 to the outside decreases.

Meanwhile, as seen from the top, the cavity 520 provided in the body 510 may have various shapes including, but being not limited to, a circular shape, a rectangular shape, a polygonal shape, an oval shape and a shape with curved corners.

The light-emitting device 530 is mounted on the first lead frame 540 and examples thereof include, but are not limited to, light-emitting devices emitting red, green, blue or white light, and light-emitting devices emitting ultraviolet light. Further, the light-emitting device 530 may be at least one.

Further, the light-emitting device 530 may be applied to all of a horizontal light-emitting device, in which all electrical terminals thereof are formed on the upper surface, a vertical light-emitting device, in which electrical terminals thereof are formed on the upper or lower surface, and a flip chip light-emitting device.

Meanwhile, the light-emitting device 530 according to this embodiment includes an intermediate layer (not shown) arranged on and/or under the active layer (not shown) to improve luminous efficiency of the light-emitting device 530 and the light-emitting device package 500.

The cavity 520 is filled with the sealant (not shown) such that the sealant covers the light-emitting device 530.

The sealant (not shown) may be composed of silicon, epoxy or other resin material and may be formed by filling the cavity 520 with a sealant, followed by UV or heat curing.

In addition, the sealant (not shown) may include a phosphor, and the phosphor is selected, considering the wavelength of light emitted from the light-emitting device 530 to allow the light-emitting device package 500 to render white light.

Depending on the wavelength of light emitted from the light-emitting device 530, such a phosphor may be at least one of blue light-emitting phosphors, bluish green light-emitting phosphors, green light-emitting phosphors, yellowish green light-emitting phosphors, yellow light-emitting phosphors, yellowish red light-emitting phosphors, orange light-emitting phosphors, and red light-emitting phosphors.

That is, the phosphor is excited by a first light emitted from the light-emitting device 530 to produce second light. For example, in the case where the light-emitting device 530 is a blue light-emitting diode and the phosphor is a yellow phosphor, the yellow phosphor is excited by blue light to emit yellow light, blue light emitted from the blue light-emitting diode is mixed with yellow light which is excited and thus produced by blue light, to allow the light-emitting device package 500 to render white light.

Similarly, in the case where the light-emitting device 530 is a green light-emitting diode, a magenta phosphor or a combination of blue and red phosphors may be exemplified, and in the case where the light-emitting device 530 is a red light-emitting diode, a cyan phosphor or a combination of blue and green phosphors may be exemplified.

Such a phosphor may be a known phosphor such as YAG, TAG, sulfides, silicates, aluminates, nitrides, carbides, nitridosilicates, borates, fluorides and phosphates.

The first and second lead frames 540 and 550 may include a metal material selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and an alloy thereof. In addition, the first and second lead frames 540 and 550 may have a monolayer or multilayer structure, but are not limited thereto.

The first and second lead frame 540 and 550 are spaced from each other and are electrically separated. The light-emitting device 530 is mounted on the first and second lead frames 540 and 550, and the first and second lead frames 540 and 550 directly contact the light-emitting device 530, or are electrically connected thereto through a conductive material such as a soldering member (not shown). In addition, the light-emitting device 530 may be electrically connected to the first and second lead frames 540 and 550 via wire bonding, although the present invention is not limited thereto. Accordingly, when a power source is connected to the first and second lead frames 540 and 550, power may be supplied to the light-emitting device 530. Meanwhile, a plurality of lead frames (not shown) are mounted in the body 510 and respective lead frames (not shown) are electrically connected to the light-emitting device 530, although the present invention is not limited thereto.

Meanwhile, referring to FIG. 60, the light-emitting device package 500 according to the embodiment may include an optical sheet 580 and the optical sheet 580 may include a base 582 and a prism pattern 584.

The base 582 is a supporter to form the prism pattern 584, which is composed of a transparent material exhibiting superior thermal stability. For example, such a transparent material may be selected from the group consisting of polyethylene terephthalate, polycarbonate, polypropylene, polyethylene, polystyrene and polyepoxy, but is not limited thereto.

In addition, the base 582 may include a phosphor (not shown). For example, the base 582 may be formed by homogenously dispersing a phosphor (not shown) in the material constituting the base 582, followed by curing. When the base 582 is formed according to this method, the phosphor (not shown) can be homogeneously dispersed throughout the base 582.

Meanwhile, a prism pattern 584 to refract and concentrate light may be arranged on the base 582. A material for the prism pattern 584 may be an acrylic resin, without being limited thereto.

The prism pattern 584 includes a plurality of linear prisms arranged in one direction on one surface of the base 582 such that the linear prisms are parallel to one another and the cross-section of the linear prisms taken along an axial direction may take the shape of a triangle.

The prism pattern 584 can concentrate light. For this reason, when the optical sheet 580 is adhered to the light-emitting device package 500 of FIG. 5, straightness of light can be improved and brightness of the light-emitting device package 500 can thus be enhanced.

Meanwhile, the prism pattern 584 may include a phosphor (not shown).

The phosphor (not shown) may be uniformly present in the prism pattern 584 by mixing the phosphor with an acrylic resin which forms the prism pattern 584 in a dispersed state to produce a paste or slurry and then forming the prism pattern 584.

In the case where the phosphor (not shown) is present in the prism pattern 584, light uniformity and distribution level of the light-emitting device package 500 are improved and the orientation angle of light-emitting device package 500 can be thus improved due to dispersion of light by the phosphor (not shown) as well as concentration of light by the prism pattern 584.

The light-emitting device package 500 according to one embodiment is arrayed in plural on the substrate and optical members such as the light guide plate, prism sheet and diffusion sheet may be arranged on a light passage of the light-emitting device package 500. The light-emitting device package, the substrate and the optical members may serve as a light unit. In another embodiment, a display device, an indicating device and a lighting device including the light-emitting device or light-emitting device packages disclosed in the afore-mentioned embodiments may be realized. For example, the lighting device may include a lamp, a streetlamp, or the like.

Figure 7A:
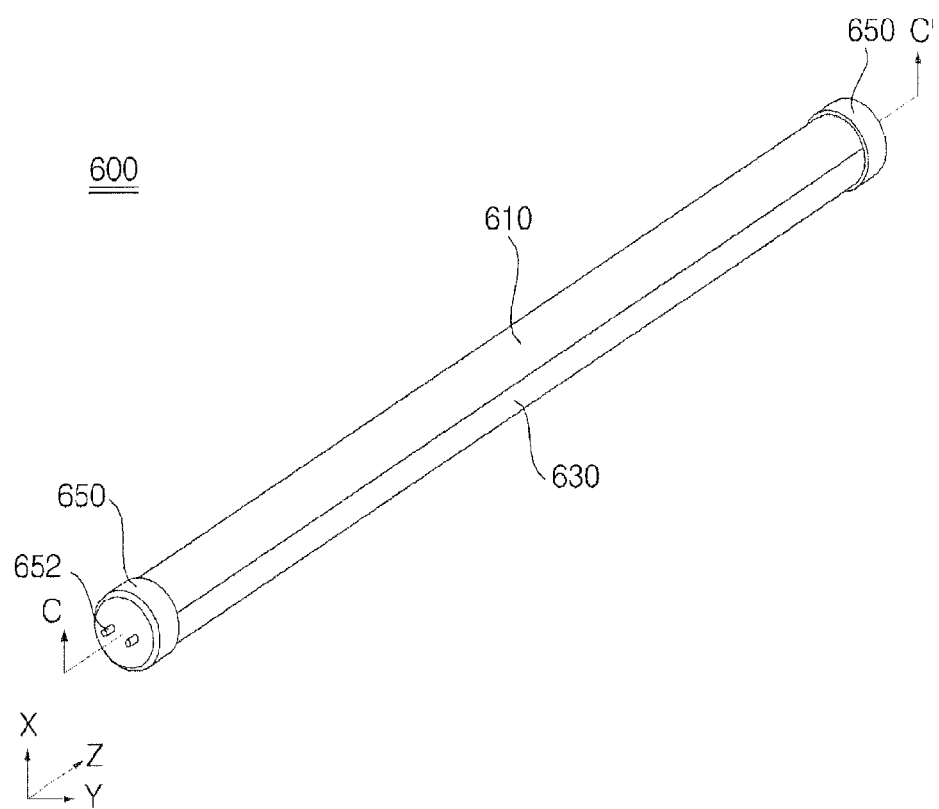
FIG. 7A is a perspective view illustrating a lighting device including the light-emitting device package.
Figure 7B:
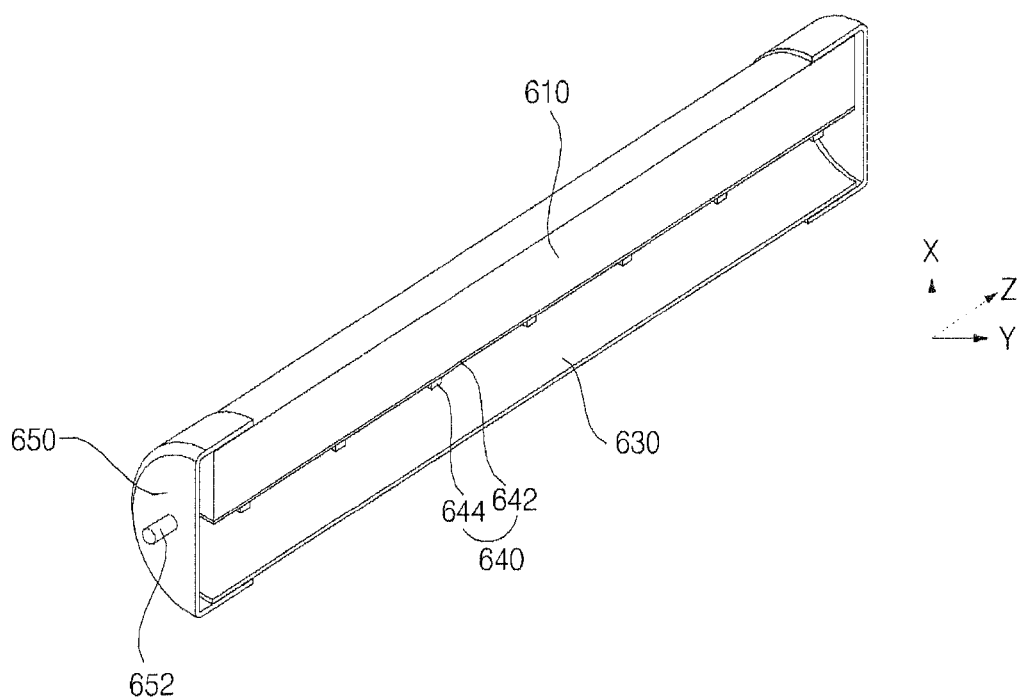
FIG. 7B is a sectional view illustrating a lighting device including the light-emitting device package.

FIG. 7A is a perspective view illustrating a lighting device including the light-emitting device package according to one embodiment. FIG. 7B is a sectional view illustrating the cross-section taken along the line of C-C' of the lighting device of FIG. 7A.

Referring to FIGS. 7A and 7B, the lighting device 600 may include a body 610, a cover 630 connected to the body 610 and an end cap 650 arranged at both ends of the body 610.

A light-emitting device module 640 is connected to the bottom of the body 610 and the body 610 may be composed of a metal material which exhibits superior conductivity and heat release effects in order to discharge heat generated from the light-emitting device package 644 to the outside through the top of the body 610.

The light-emitting device packages 644 having multiple colors are mounted on the PCB 642 in multiple rows to constitute an array, and may be spaced from one another by a predetermined distance or by different distances, as necessary, to control brightness. The PCB 642 may be a metal core PCB (MPPCB) or PCB made of FR4.

In particular, each light-emitting device package 644 includes a light-emitting device (not shown), and the light-emitting device (not shown) includes a reflective layer (not shown) to improve light extraction efficiency and thereby improve luminous efficiency of the light-emitting device package 644 and the lighting device 600.

The light-emitting device package 644 includes an extended lead frame (not shown) to improve heat radiation and thus enhance reliability and efficiency of the light-emitting device packages 644, and lengthen the lifespan of the lighting device 600 including the light-emitting device package 644 and the light-emitting device package 644.

The cover 630 may take the shape of a circle to surround the bottom of the body 610, without being limited thereto.

The cover 630 protects the light-emitting device module 640 from foreign substances. In addition, the cover 630 prevents glare generated from the light-emitting device package 644 and includes diffusion particles to uniformly discharge light to the outside. In addition, a prism pattern or the like may be formed on at least one of the inner and outer surfaces of the cover 630. Alternatively, a phosphor may be applied onto at least one of the inner and outer surfaces of the cover 630.

Meanwhile, the cover 630 should exhibit superior light transmittance, in order to discharge light generated from the light-emitting device package 644 through the cover 630 to the outside, and the cover 630 should exhibit sufficient heat resistance in order to endure heat emitted by the light-emitting device package 644. Preferably, the cover 630 is composed of a material including polyethylene terephthalate (PET), polycarbonate (PC) or polymethyl methacrylate (PMMA) and the like.

The end cap 650 is arranged on both ends of the body 610 and may be used to seal a power device (not shown). In addition, the end cap 650 may include a power pin 652, allowing the lighting device 600 to be applied to a conventional terminal from which a fluorescent light has been removed, without using any additional device.

Figure 8:
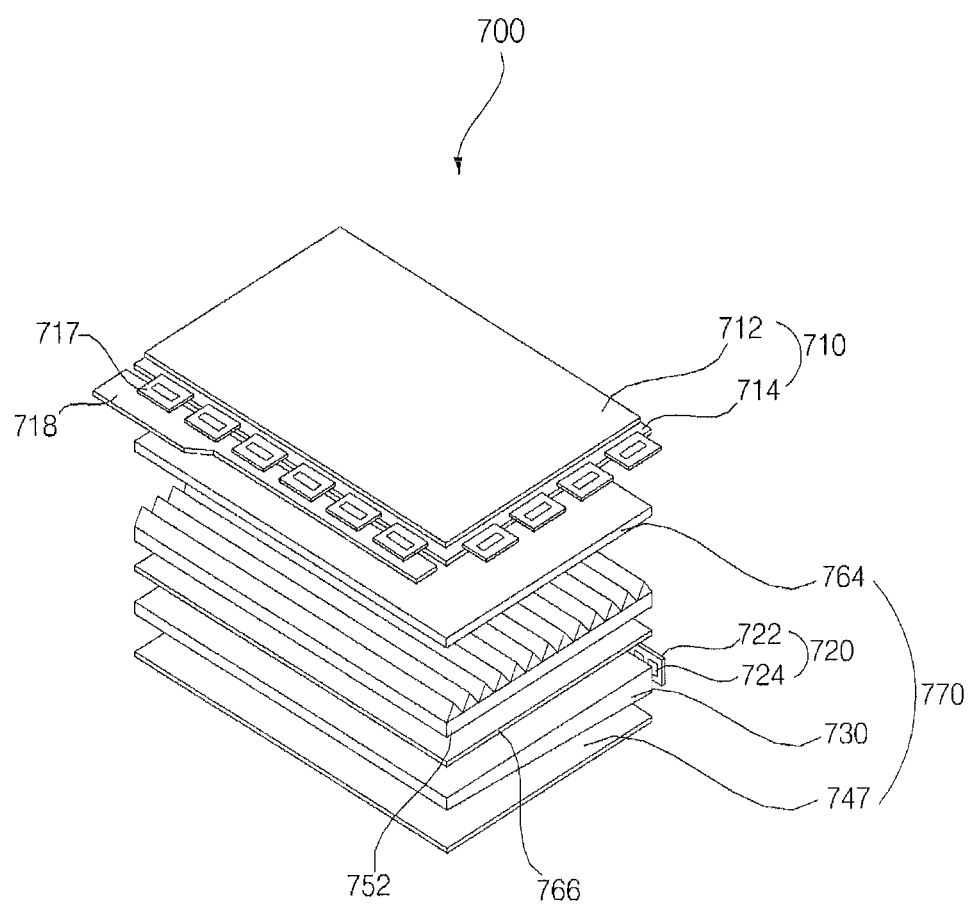
FIG. 8 is an exploded perspective view illustrating a liquid crystal display including the light-emitting device according to an embodiment.

FIG. 8 is an exploded perspective view illustrating a liquid crystal display including the light-emitting device according to one embodiment.

FIG. 8 illustrates an edge-light type liquid crystal display device 700 which includes a liquid crystal display panel 710 and a backlight unit 770 to supply light to the liquid crystal display panel 710.

The liquid crystal display panel 710 displays an image using light supplied from the backlight unit 770. The liquid crystal display panel 710 includes a color filter substrate 712 and a thin film transistor substrate 714 which face each other such that a liquid crystal is interposed therebetween.

The color filter substrate 712 can realize color images to be displayed through the liquid crystal display panel 710.

The thin film transistor substrate 714 is electrically connected to a printed circuit board 718 on which plurality of circuit components are mounted through a driving film 717. The thin film transistor substrate 714 responds to drive signals supplied from the printed circuit board 718 and may apply drive voltage from the printed circuit board 718 to liquid crystals.

The thin film transistor substrate 714 includes a thin film transistor and a pixel electrode formed as a thin film on other substrates composed of a transparent material such as glass or plastic.

The backlight unit 770 includes a light-emitting device module 720, a light guide plate 730 to convert light emitted from the light-emitting device module 720 into a surface light source and supply the light to the liquid crystal display panel 710, a plurality of films 750, 766 and 764 to uniformize brightness of light from the light guide plate 730 and improve vertical incidence, and a reflective sheet 740 to reflect light emitted to the back of the light guide plate 730 to the light guide plate 730.

The light-emitting device module 720 includes a plurality of light-emitting device packages 724 and a PCB 722 on which the light-emitting device packages 724 are mounted to form an array.

In particular, each light-emitting device package 724 includes a light-emitting device (not shown), and the light-emitting device (not shown) includes an intermediate layer (not shown) arranged on and/or under the active layer (not shown) to improve luminous efficacy of the light-emitting device (not shown), the light-emitting device packages 724 and the liquid crystal display device 700.

Meanwhile, the backlight unit 770 includes a diffusion film 766 to diffuse light incident from the light guide plate 730 toward the liquid crystal display panel 710, a prism film 750 to concentrate the diffused light and thus improve vertical incidence and a protective film 764 to protect the prism film 750.

Figure 9:
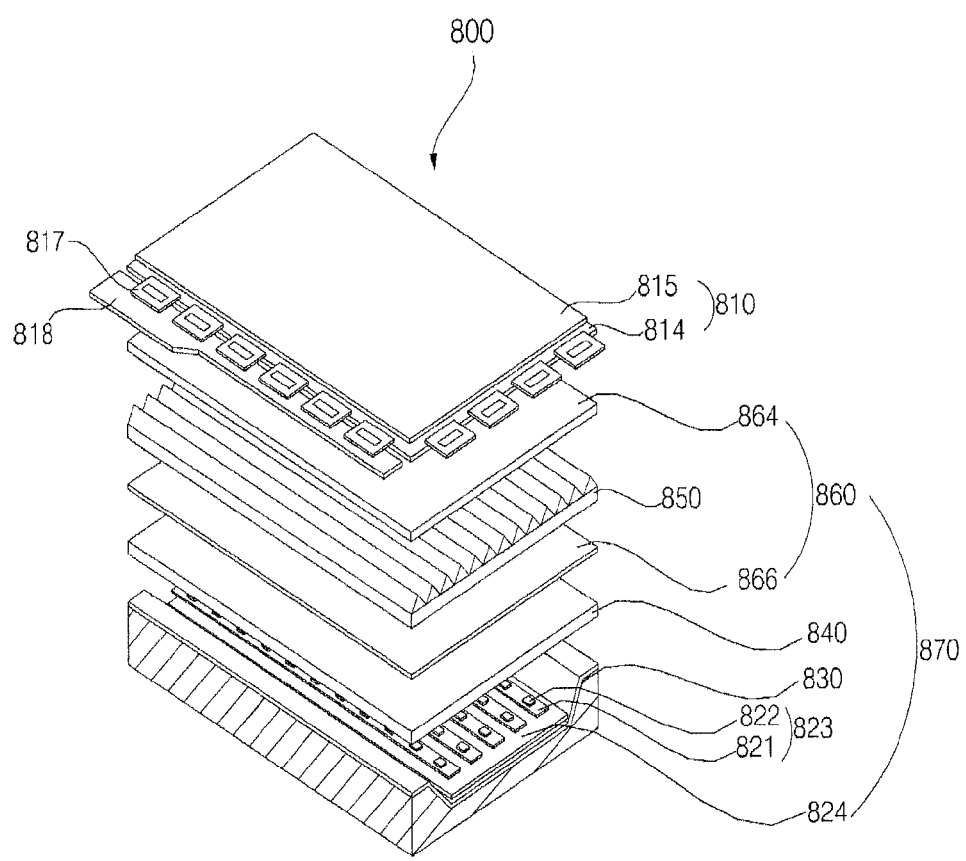
FIG. 9 is an exploded perspective view illustrating a liquid crystal display including the light-emitting device according to an embodiment.

FIG. 9 is an exploded perspective view illustrating a liquid crystal display including the light-emitting device according to one embodiment. The contents illustrated and described in FIG. 7 are not mentioned in detail.

FIG. 9 illustrates a direct-type liquid crystal display device 800 which includes a liquid crystal display panel 810 and a backlight unit 870 to supply light to the liquid crystal display panel 810.

The liquid crystal display panel 810 is described in FIG. 7 and a detailed explanation thereof is omitted.

The backlight unit 870 includes a plurality of light-emitting device modules 823, a reflective sheet 824, a lower chassis 830 in which the light-emitting device modules 823 and the reflective sheet 824 are accepted, a diffusion plate 840 arranged on the light-emitting device modules 823, and a plurality of optical films 860.

Each light-emitting device module 823 includes a plurality of light-emitting device packages 824 and a PCB 821 on which the light-emitting device packages 824 are mounted to form an array.

In particular, each light-emitting device package 822 includes a light-emitting device (not shown), and the light-emitting device (not shown) includes an intermediate layer (not shown) arranged on and/or under the active layer (not shown) to improve luminous efficacy of the light-emitting device (not shown), the light-emitting device packages 822 and the liquid crystal display device 800.

The reflective sheet 824 reflects light generated from light-emitting device package 822 toward the liquid crystal display panel 810 to improve luminous efficacy.

Meanwhile, light emitted from the light-emitting device module 823 is incident on the diffusion plate 840 and an optical film 860 is arranged on the diffusion plate 840. The optical film 860 includes a diffusion film 866, a prism film 850 and a protective film 864.

The features, structures and effects illustrated in the above embodiments may be included in at least one embodiment of the present invention but are not limited to one embodiment. Further, those skilled in the art will appreciate that various combinations and modifications of the features, structures and effects illustrated in the respective embodiments are possible. Therefore, it will be understood that these combinations and modifications are covered by the scope of the invention.

Although the embodiments of the present invention have been disclosed for illustrative purposes, those skilled in the art will appreciate that various modifications, additions and substitutions are possible, without departing from the scope and spirit of the invention as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:

1. A light-emitting device, comprising:
a support member;
a light-emitting structure on the support member, the light-emitting structure including a first semiconductor layer, a first intermediate layer, an active layer, a second intermediate layer, and a second semiconductor layer; and
a buffer layer interposed between the support member and the light-emitting structure, wherein at least one of the first and second intermediate layers comprises at least four layers,
wherein the at least four layers have different band gaps from each other,
wherein, among the at least four layers, a layer having the largest band gap contacts a layer having the smallest band gap,
wherein the first intermediate layer is between the first semiconductor layer and the active layer,
wherein the second intermediate layer is between the second semiconductor layer and the active layer,
wherein the first and second intermediate layers contact the active layer,
wherein the layer having the largest band gap includes AlGaN, and
wherein the layer having the smallest band gap includes InN.

2. The device according to claim 1, further comprising a light-transmitting electrode layer formed on the second semiconductor layer.

3. The device according to claim 1, further a light extraction structure formed over an upper surface of the light-emitting structure.

4. The device according to claim 1, wherein at least one of the at least four layers further includes GaN.

5. The device according to claim 1, wherein at least one of the at least four layers further includes InGaN.

6. The device according to claim 1, wherein at least one of the at least four layers includes GaN, and InGaN, and
wherein the at least one layer including GaN contacts the at least one layer including InGaN.

7. The device according to claim 1, wherein the at least one intermediate layer has a super-lattice structure in which the at least four layers are repeatedly laminated.

8. The device according to claim 1, wherein each of the at least four layers has a thickness of 5 to 100 Å.

9. The device according to claim 1, wherein at least one of the at least four layers is doped with an n-type impurity.

10. The device according to claim 9, wherein the n-type impurity comprises at least one of Si, Ge and Sn.

11. The device according to claim 1, wherein at least one of the at least four layers is doped with a p-type impurity.

12. The device according to claim 11, wherein the p-type impurity comprises at least one of Mg, Zn, Ca, Sr and Ba.

13. The device according to claim 1, wherein at least one of the at least four layers is an undoped layer which is not doped.

14. The device according to claim 1, wherein the at least one intermediate layer includes an impurity added to at least one region thereof.

15. The device according to claim 14, the impurity is indium (In).

16. A light-emitting device package, comprising:
a body;
a first lead frame and a second lead frame on the body; and
a light-emitting device mounted on the body and electrically connected to the first and second lead frames, wherein the light-emitting device comprises:
a support member;
a light-emitting structure on the support member, the light-emitting structure including a first semiconductor layer, a first intermediate layer, an active layer, a second intermediate layer and a second semiconductor layer; and
a buffer layer interposed between the support member and the light-emitting structure, wherein at least one of the first and second intermediate layers comprises at least four layers,
wherein the at least four layers have different band gaps from each other,
wherein, among the at least four layers, a layer having the largest band gap contacts a layer having the smallest band gap,
wherein the first intermediate layer is between the first semiconductor layer and the active layer,
wherein the second intermediate layer is between the second semiconductor layer and the active layer,
wherein the first and second intermediate layers contact the active layer,
wherein the layer having the largest band gap includes AlGaN, and
wherein the layer having the smallest band gap includes InN.

17. A lighting system, comprising:
a body; and
a light-emitting module arranged on the body, and on which a light-emitting device is mounted, wherein the light-emitting device comprises:
a support member;
a light-emitting structure on the support member, the light-emitting structure including a first semiconductor layer, a first intermediate layer, an active layer, a second intermediate layer and a second semiconductor layer; and
a buffer layer interposed between the support member and the light-emitting structure, wherein at least one of the first and second intermediate layers comprises at least four layers,
wherein the at least four layers have different band gaps from each other,
wherein, among the at least four layers, a layer having the largest band gap contacts a layer having the smallest band gap,
wherein the first intermediate layer is between the first semiconductor layer and the active layer,
wherein the second intermediate layer is between the second semiconductor layer and the active layer,
wherein the first and second intermediate layers contact the active layer,
wherein the layer having the largest band gap includes AlGaN, and
wherein the layer having the smallest band gap includes InN.

* * * * *